(12) United States Patent
Gu

(10) Patent No.: US 9,864,281 B2
(45) Date of Patent: Jan. 9, 2018

(54) MOVABLE PRESSING AND LIGHT-SHIELDING MECHANISM FOR DIGITAL STEREO IMAGE PRINTING AND METHOD THEREFOR

(71) Applicant: Jinchang Gu, Shanghai (CN)

(72) Inventor: Jinchang Gu, Shanghai (CN)

(73) Assignee: Shanghai Yiying Digital Technology Co., Ltd., Shanghai (CN)

( * ) Notice: Subject to any disclaimer, the term of this patent is extended or adjusted under 35 U.S.C. 154(b) by 124 days.

(21) Appl. No.: 14/413,942

(22) PCT Filed: Jul. 19, 2013

(86) PCT No.: PCT/CN2013/079652
§ 371 (c)(1),
(2) Date: Jan. 9, 2015

(87) PCT Pub. No.: WO2014/012512
PCT Pub. Date: Jan. 23, 2014

(65) Prior Publication Data
US 2015/0153658 A1 Jun. 4, 2015

(30) Foreign Application Priority Data

Jul. 20, 2012 (CN) .......................... 2012 1 0253334

(51) Int. Cl.
| | |
|---|---|
| G03B 27/42 | (2006.01) |
| G03F 7/20 | (2006.01) |
| G03B 27/58 | (2006.01) |
| G03B 27/50 | (2006.01) |
| G03B 35/24 | (2006.01) |

(52) U.S. Cl.
CPC ......... *G03F 7/70716* (2013.01); *G03B 27/50* (2013.01); *G03B 27/58* (2013.01); *G03B 35/24* (2013.01)

(58) Field of Classification Search
CPC .. G03F 7/70716; G03F 7/707; G03F 7/70758; G03F 7/70775; G03F 7/70725; G03F 7/20; G03F 7/70816; G03F 7/2051; G03F 7/70825; G03F 9/7015; G03F 7/70; G03F 7/7035; G03F 7/70366; G03F 7/70383; G03F 7/70416; G03F 7/70425; G03F 9/7038; G03F 27/05
See application file for complete search history.

(56) References Cited

U.S. PATENT DOCUMENTS

| | | | | |
|---|---|---|---|---|
| 5,983,123 | A * | 11/1999 | Shmulewitz | A61B 6/50 |
| | | | | 128/915 |
| 2012/0038899 | A1* | 2/2012 | Ahn | G01B 11/00 |
| | | | | 355/72 |

* cited by examiner

Primary Examiner — Mesfin Asfaw

(57) ABSTRACT

A movable pressing and light-shielding mechanism for digital stereo image printing comprises a base (1), multiple gantries (2), a photosensitive platform (3) and an exposure system device (4); wherein the base (1) has a groove inside which the photosensitive platform (3) is provided. The number of the gantries (2) is two. The two gantries (2) are provided in parallel and fixed on the base (1) and a slideway (22) is provided between the two gantries (2). A screw is provided in the slideway (22). One end of the screw is connected with a second motor (12). The motor (12) is connected with the exposure system device (4). A top end face of the exposure system device (4) is connected with the screw. A laser scan line opening is provided on a bottom surface of the exposure system equipment (4).

7 Claims, 3 Drawing Sheets

MOVABLE PRESSING AND LIGHT-SHIELDING MECHANISM FOR DIGITAL STEREO IMAGE PRINTING AND METHOD THEREFOR

CROSS REFERENCE OF RELATED APPLICATION

This is a U.S. National Stage under 35 U.S.C 371 of the International Application PCT/CN2013/079652, filed Jul. 19, 2013, which claims priority under 35 U.S.C. 119(a-d) to CN 201210253334.0, filed Jul. 20, 2012.

BACKGROUND OF THE PRESENT INVENTION

Field of Invention

The present invention relates to an image printing device and a method therefor, and more particularly to a movable pressing and light-shielding mechanism for digital stereo image printing and a method therefor.

Description of Related Arts

With the gradual development of digital stereo image industry, the digital stereo image printing device has developed from small sized digital stereo images printing devices adopting LCD (Liquid Crystal Display) as a display device for projection imaging to digital laser stereo printing devices adopting laser scanning exposure imaging.

Due to the consumers have different vision distance on digital stereo images and different appreciating and accepting requirements for visual environments, stereo grating photographic materials adopted by digital stereo printing device are different. The digital stereo printing device generally utilizes two types of stereo grating photographic materials. The commonly utilized stereo grating photographic material is an ultra-thin shaped stereo grating photographic material which curls easily, has a thin thickness, fine optical grating lines and is directly coated with silver halides on the back of the optical grating or adheres the photosensitive material and the optical grating to form an ultra-thin shaped stereo grating photographic material. The ultra-thin shaped stereo grating photographic material is simple and convenient for printing technique of a digital stereo printing device. In addition the ultra-thin shaped stereo grating photographic material is firstly combined, then performed with projection sensitization, and then are printed and dried to form a stereo. This kind of stereo images has a fine quality and a close viewing distance.

Another kind of stereo grating photographic material has a high thickness and is not capable of crimping, the optical grating has thick lines. Thus this kind of stereo grating photographic material can't be put into a stereo printing system for an automatic printing, can't be covered with silver halides on a back of the optical grating. Furthermore, the photosensitive material and the optical grating can't be adhered in advance. This kind of thick optical grating photographic material has a complicated printing technique in the digital stereo printing device. This kind of thick optical grating photographic material can only be performed with superimposition firstly and then projection to have an exposure of a latent image. Then the photographic material and the optical grating are separated, printed and dried to form an image, and then the image is combined with the optical grating to from a stereo. This kind of stereo has a far vision distance, a good stereo sense. However, the method is not suitable for printing devices of common digital stereo images. In addition, besides the digital stereo printing device, the method requires a high quality of technical skills, has complicated techniques and unsteady quality. The stereo partial focus point is fuzzy sometimes, which is particularly critical to the success of composition of the image and the optical grating by lines.

SUMMARY OF THE PRESENT INVENTION

Accordingly, in order to achieve the objects mentioned above, the present invention provides a movable pressing and light-shielding mechanism for digital stereo image printing comprising a base, multiple gantries, a photosensitive platform and an exposure system device;

wherein the base has a groove inside which the photosensitive platform is provided;

an amount of the gantries is two, the two gantries are provided in parallel and fixed on the base, a slideway is provided between the two gantries;

a screw is provided in the slideway, one end of the screw is connected with a second motor; and the second motor is connected with the exposure system device;

two sliding blocks are provided on an top end face of the exposure system device, and the exposure system device is connected with the screw via the two sliding blocks; and a laser scan line opening is provided on a bottom surface of the exposure system equipment.

A photographic paper conveyor is provided on the photosensitive platform, and the photographic paper conveyor has a plurality of suction holes and is sleeved on the photosensitive platform;

Two first motors are respectively provided on two sides of the base, and are connected with the exposure system device;

two endless round belts are respectively provided in parallel on a front side and a back side of the base;

two rollers are respectively provided in parallel on a left side and a right side of the up surface of the base, and two shutter devices are respectively provided above the two rollers, the two rollers run through the base and the photosensitive platform;

the two endless round belts are respectively sleeved on the two rollers, and the two first motors provided on two sides of the base are respectively connected with two ends of the rollers via two tyres.

Two optical grating clamping mechanisms are respectively and movably provided on two sides of the photosensitive platform, the two optical grating clamping mechanisms respectively comprise an optical grating mound layer fixing plate, a optical grating mound layer and an air cylinder, the air cylinder is connected with the exposure system device, the optical grating mound layer fixing plate is movably provided on two sides above the photosensitive platform, and the optical grating mound layer is provided on the optical grating mound layer fixing plate.

An optical grating pressing mechanism is provided on the photosensitive platform, the optical grating pressing mechanism comprises a sliding block fixing plate, two sliding blocks, a slideway fixing plate, a light shielding pressure roller, a pressure plate roller set fixing plate, a pressure plate roller set side plate and a strengthening support rod;

an air cylinder is provided on the sliding block fixing plate and the two sliding block are fixed on two ends of the sliding block fixing plate, an air cylinder connecting unit is provided on the pressure plate roller set fixing plate and the two sliding blocks are fixed two ends of the sliding block fixing plate;

an laser scan line opening is provided between the light shielding pressure roller, two parallel slideways are provided on a rear surface of the pressure plate roller set fixing plate; and the slideway fixing plate has two sliding blocks provided thereon and is limited in the slideway of the pressure plate roller set fixing plate via the sliding blocks, so as to form a flexible connection;

the pressure plate roller set side plate is mounted on the pressure plate roller set fixing plate, two light shielding pressure rollers are provided on a bottom of the the pressure plate roller set side plate.

The two sliding blocks of the sliding block fixing plate of the optical grating pressing mechanism are respectively provided on the two endless round belts.

A roll of roller shutter having a same size with an upper surface of the base is respectively provided in the two shutter devices, wherein a first end of each of the roller shutters is mounted inside each of the shutter device and a second end thereof is mounted on the sliding block fixing plate of the optical grating pressing mechanism.

A method for the movable pressing and light-shielding mechanism for digital stereo image, comprises following steps of:

step S1: before running the movable pressing and light-shielding mechanism, putting an optical grating in a photosensitive platform, so as to clamp the optical grating by an optical grating mound layer and an optical grating mound layer fixing plate, obtaining information of an image from a computer by an exposure system device, wherein a sheet of photographic material automatically enters between the photographic paper conveyor and the optical grating on the photosensitive platform, and a photographic paper conveyor sleeved on the photosensitive platform has a plurality of suction holes to facilitate adsorbing the photosensitive material entered;

at present, receiving a command by air cylinders on two optical grating mound layer fixing plate which clamps the optical grating, in such a manner that an optical grating clamping mechanism drives the optical grating to press downward to the photosensitive material, simultaneously, two first motors on two side faces of the base start to operate, so as to drive two rollers to rotate right, the two rollers rotated right drives two endless round belts provided thereon to move right, and the two endless round belts drive the optical grating pressing mechanism provided thereon to move right; meanwhile, two shutter device start to operate as well, a right shutter device recycles one of the rollers shutters and a left shutter device releases the other of the roller shutters, in such a manner that the base is covered all the time, in such a manner that the grating photographic material in the photosensitive platform is not mapped by beams, meanwhile, an air cylinder on the optical grating pressing mechanism starts to operate, in such a manner that a slideway fixing plate is pressed downward, two sliding blocks on the slideway fixing plate are forced to move downward along two slideways of a pressure plate roller set fixing plate, respectively, so as to drive the pressure plate roller set fixing plate to push downward, in such a manner that the light shielding pressure rollers are capable of compressing the optical grating and a part of the photosensitive material closely together; meanwhile, a second motor on a gantry receives an instruction from the exposure system device to drive a screw to rotate, the screw rotated drives two sliding blocks on the exposure system device to move right, in such a manner that the exposure system device starts to move right, wherein the exposure system device and the optical grating pressing mechanism move synchronously in a relatively static manner, wherein the exposure system device emits laser via a laser scan line opening provided on a bottom thereof, the laser emitted is applied on two light shielding pressure rollers of the optical grating pressing mechanism, wherein since a laser scan line hole is provided between the two light shielding pressure rollers, the laser emitted by the exposure system device passes through the laser scan line hole between the two light shielding pressure rollers and performs a first scanning exposure on the photographic material;

when the first scanning exposure is finished, the air cylinder of the optical grating pressing mechanism operates to lift up the light shielding pressure rollers on the pressure plate roller set fixing plate, the air cylinders on the optical grating mound layer fixing plates operates to keep the optical grating mound layer fixing plate pressing on the photosensitive platform;

meanwhile the first motors on the base starts to rotate left and drive the two rollers to rotate, then the two rollers drives the optical grating pressing mechanism to move left, then the two shutter devices start to operate simultaneously, the left shutter device collects one of the roller shutters and the right shutter device releases the other of the roller shutters, in such a manner that the base is covered all the time, meanwhile the motor on the gantry receives an instruction from the exposure system device to drive the screw to rotate, the screw rotated drives the exposure system device to move left, the exposure system device and the optical grating pressing mechanism move left synchronously in opposite position, so as to return back to an original position;

step S2: sending information of a second image by the computer when the first scanning exposure is finished, wherein when the exposure system device receives the information, the photosensitive platform starts to deviate from a position thereof in the step S1, so as to have a different position with a scan line in the step S1, meanwhile the exposure system device, the optical grating pressing mechanism and the shutter devices start to synchronously move right to complete second scanning exposure, when the second scanning exposure is completed, the exposure system device, the optical grating pressing mechanism, the photosensitive platform and the shutter device all return back to original positions;

step S3: sending information of a third image by the computer when the second scanning exposure is finished, wherein when the exposure system device receives the information, the photosensitive platform starts to deviate from a position in the step S2, so as to have a different position with a scan line in the step S2, meanwhile the exposure system device, the optical grating pressing mechanism and the shutter device start to synchronously move right to complete a third scanning exposure;

S4: repeating the step S2 and S3 until all scans are completed, wherein the air cylinder of the optical grating mound layer fixing plate on the photosensitive platform receives an instruction from the exposure system device to elevate the optical grating mound layer fixing plates to an original position, then the optical grating is elevated and the photosensitive material below the optical grating enters a developing device for developing.

Preferably, the method further comprises a step of selecting a prototype grating before the step S1, which comprises steps of before printing a stereo image which has a far vision distance and a good stereoscopic effects, determining a number of lines of the optical grating, and selecting any sheet of optical grating from a batch of optical grating sheets which are punched with needle-shaped focus hole to be placed on the photosensitive platform for serving as the prototype grating and clamping the optical grating clamping mechanisms on two sides of the photosensitive platform.

Preferably, the method further comprises a step of: when thick optical gratings in a same batch is utilized in other dedicated device, punching a plurality of focus holes on two ends and two sides of the optical grating according to the line ways thereof before the step S1.

The method further comprises a step after the step S4 of combining alignment of holes of a stereo image printed and dried by projection photoreception, photoreception focusing points and a batch of optical gratings having focus holes.

Figure 1:
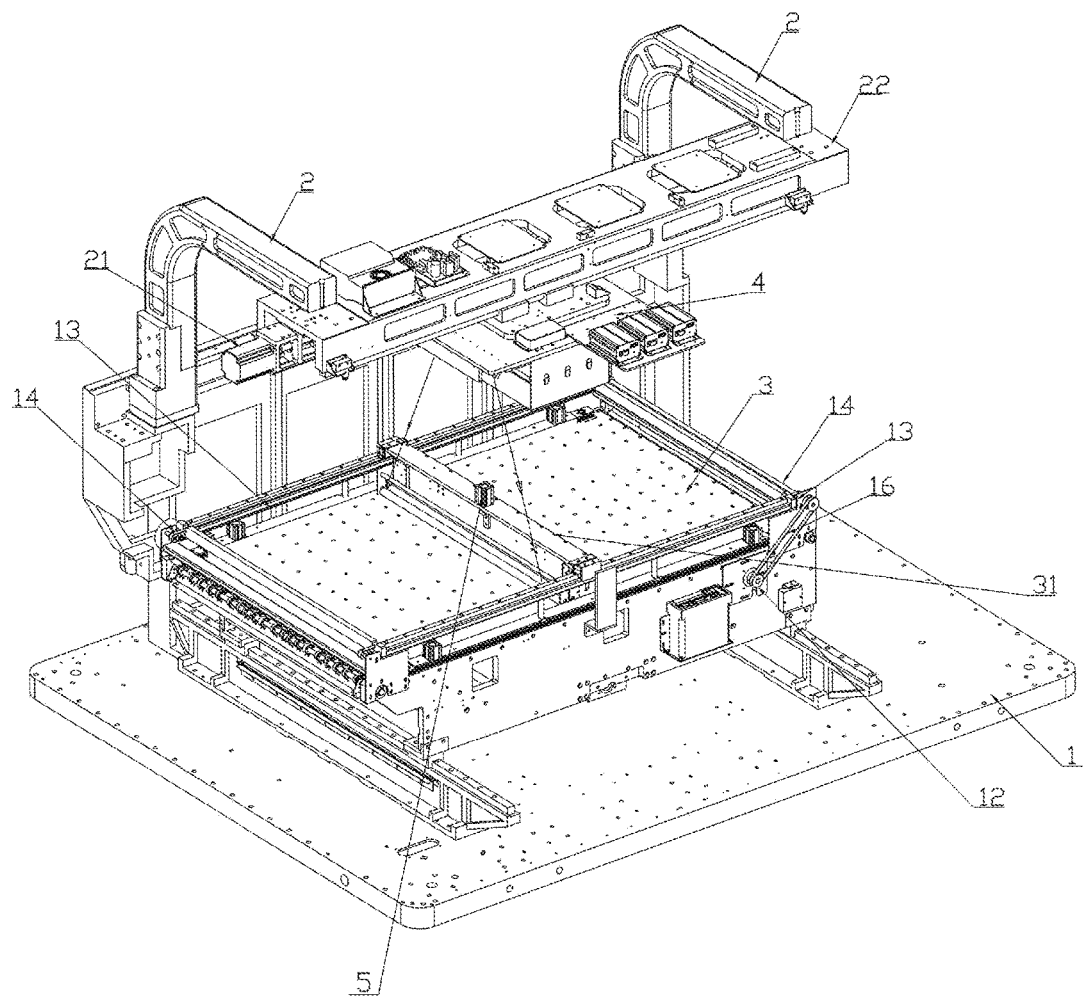
FIG. 1 is a structural schematic view of a movable pressing and light-shielding mechanism according to a preferred embodiment of the present invention.
Figure 2:
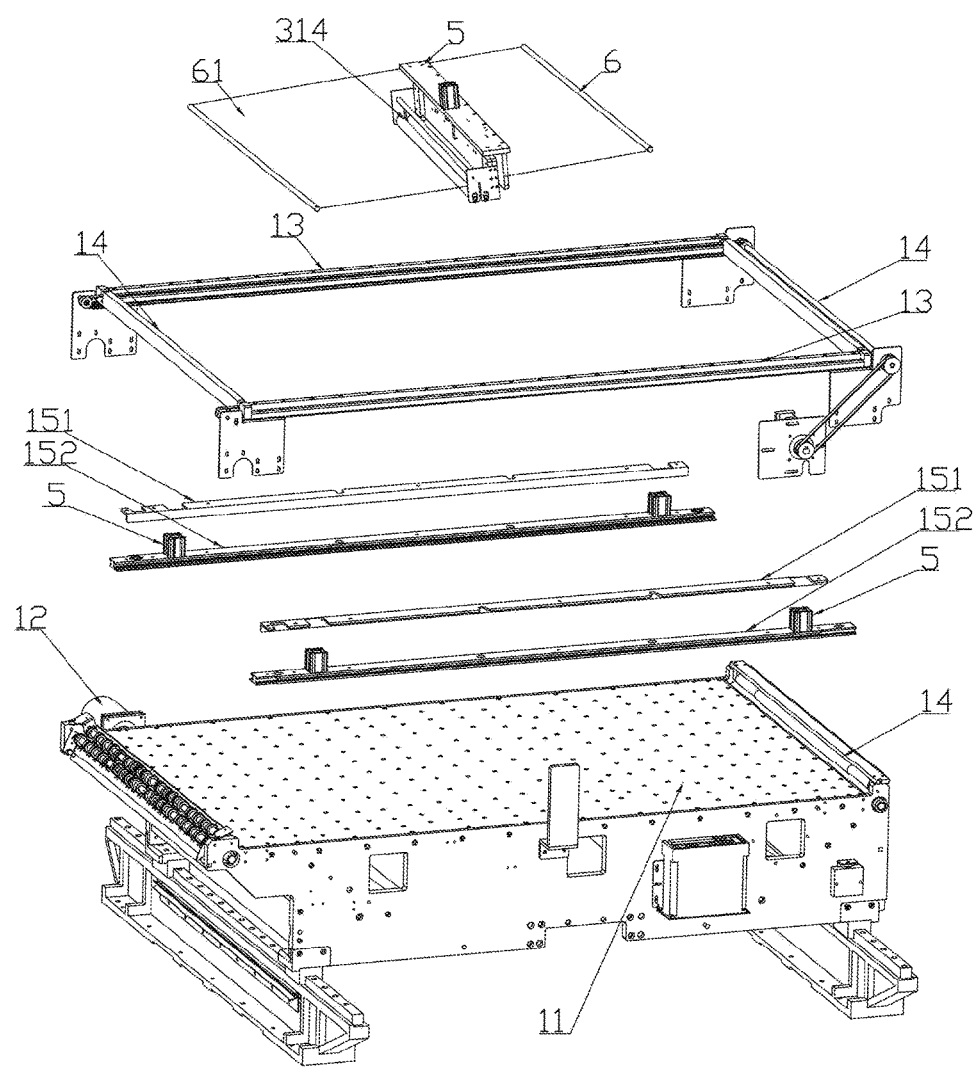
FIG. 2 is a partial decomposition diagram of the movable pressing and light-shielding mechanism according to the preferred embodiment of the present invention mentioned above.
Figure 3:
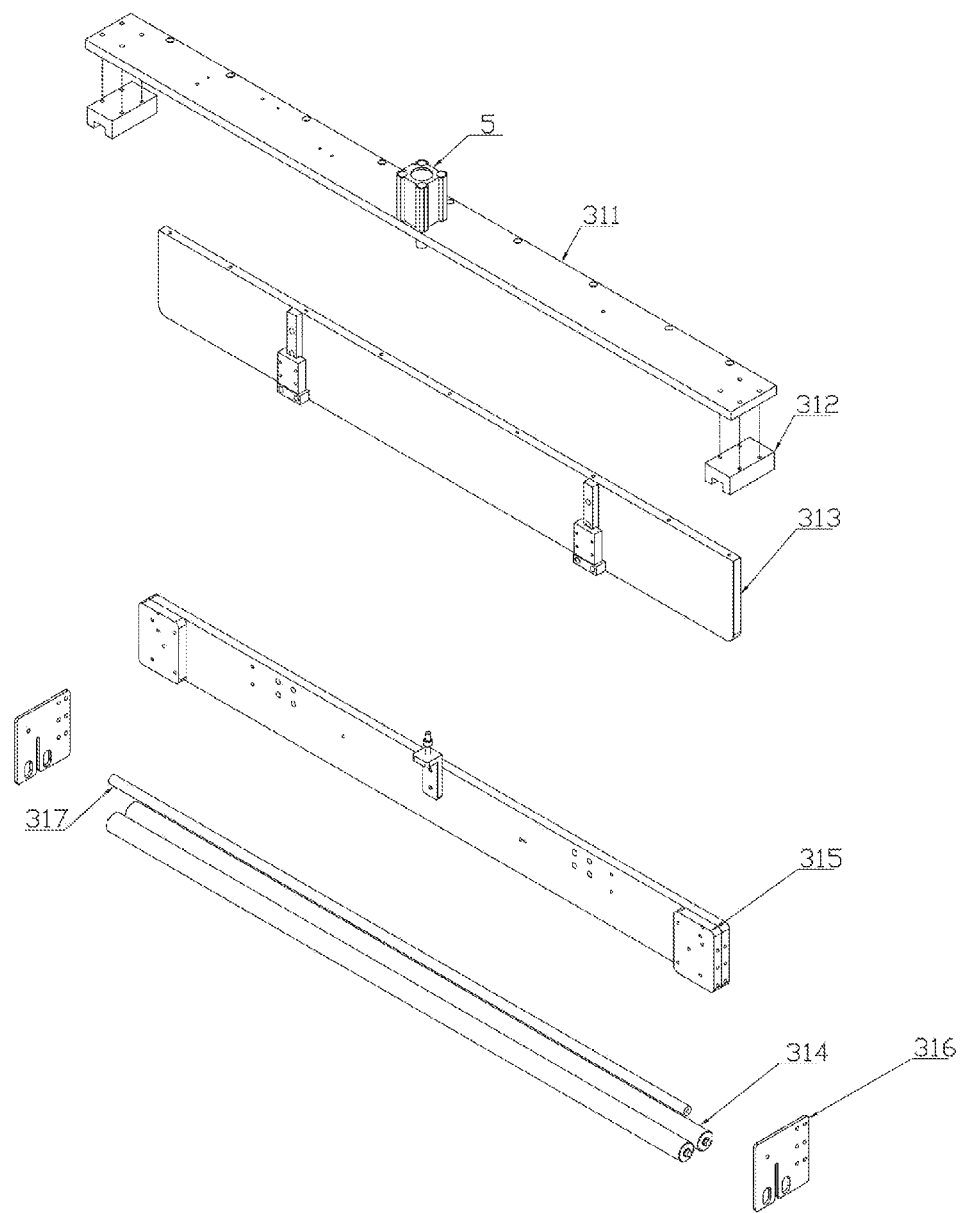
FIG. 3 is a decomposition diagram of an optical grating pressing mechanism according to another preferred embodiment of the present invention.

Reference numbers in the FIGS. 1~3: 1—base; 2—gantry; 3—photosensitive platform; 4—exposure system device; 5—air cylinder; 6—shutter device; 61—roller shutters; 11—photographic paper conveyor; 12—first motor; 13—endless round belt; 14—roller; 16—tyre; 21—second motor; 22—slideway; 31—optical grating pressing mechanism; 151—optical grating mound layer; 152—optical grating mound layer fixing plate; 311—sliding block fixing plate; 312—sliding block; 313—slideway fixing plate; 314—light shielding pressure roller; 315—pressure plate roller set fixing plate; 316—pressure plate roller set side plate; 317—strengthening support rod.

DETAILED DESCRIPTION OF THE PREFERRED EMBODIMENT

As shown in FIGS. 1-3, a movable pressing and light-shielding mechanism for digital stereo image printing comprises a base 1, multiple gantries 2, a photosensitive platform 3 and an exposure system device 4; wherein the base 1 has a groove inside which the photosensitive platform 3 is provided; an amount of the gantries 2 is two, the two gantries 2 are provided in parallel and fixed on the base 1, a slideway 22 is provided between the two gantries 2; a screw is provided in the slideway 22, one end of the screw is connected with a second motor 21; and the second motor 21 is connected with the exposure system device 4; two sliding blocks are provided on an top end face of the exposure system device 4, and the exposure system device 4 is connected with the screw via the two sliding blocks; and a laser scan line opening is provided on a bottom surface of the exposure system device 4.

A photographic paper conveyor is provided on the photosensitive platform 3, and the photographic paper conveyor has a plurality of suction holes and is sleeved on the photosensitive platform 3; two first motors 12 are respectively provided on two sides of the base 1, and are connected with the exposure system device 4; two endless round belts 13 are respectively provided in parallel on a front side and a back side of an up surface of the base 1; two rollers 14 are respectively provided in parallel on a left side and a right side of the up surface of the base 1, and two shutter devices 6 are respectively provided above the two rollers 14, the two rollers 14 run through the base 1 and the photosensitive platform 3; the endless round belts 13 are respectively sleeved on the two rollers 14, and the two first motors 12 provided at one side of the base 1 are respectively connected with an end of the two rollers 14 via two tyres 16.

Two optical grating mound layers 151 and two optical grating mound layer fixing plates 152 with an air cylinder 5 are respectively provided on two sides of the photosensitive platform 3, the air cylinder 5 is connected with the exposure system device 4, the optical grating mound layer fixing plates 152 are moveably provided on the photosensitive platform 3, and the two optical grating mound layers 151 are respectively provided on the two optical grating mound layer fixing plates 152.

An optical grating pressing mechanism 31 is provided on the photosensitive platform 3, the optical grating pressing mechanism 31 comprises a sliding block fixing plate 311, two sliding blocks 312, a slideway fixing plate 313, two light shielding pressure rollers 314, a pressure plate roller set fixing plate 315, two pressure plate roller set side plates 316 and a strengthening support rod 317; an air cylinder 5 is provided on the sliding block fixing plate 311 and the two sliding blocks 312 are respectively fixed on two ends of the sliding block fixing plate 311, an air cylinder connecting unit is provided on the pressure plate roller set fixing plate 315 and connected with the air cylinder 5 on the sliding block fixing plate 311; a laser scan line opening is provided between the two light shielding pressure rollers 314, two parallel slideways are provided on a rear surface of the pressure plate roller set fixing plate 315; the slideway fixing plate 313 has two sliding blocks provided thereon and is limited in the two slideways of the pressure plate roller set fixing plate 315 via the sliding blocks, respectively, so as to form a flexible connection; the two pressure plate roller set side plates 316 are fixed on the pressure plate roller set fixing plate 315, the two light shielding pressure rollers 314 are provided on a bottom of the pressure plate roller set side plates 316.

The two sliding blocks 312 of the sliding block fixing plate 311 of the optical grating pressing mechanism 31 are respectively provided on two endless round belts 13.

Two rolls of roller shutters 61 having a same size with an upper surface of the base 1 are respectively provided in the two shutter devices 6, wherein a first end of each of the roller shutters 61 is mounted inside each of the shutter devices 6 and a second end thereof is mounted on the sliding block fixing plate 311 of the optical grating pressing mechanism 31.

A method for the movable pressing and light-shielding mechanism for digital stereo image, comprises following steps of:

step S1: before running the movable pressing and light-shielding mechanism, putting an optical grating in a photosensitive platform 3, obtaining information of an image from a computer by an exposure system device 4, wherein a sheet of photographic material enters between the photosensitive platform 3 and the optical grating, and a photographic paper conveyor sleeved on the photosensitive platform 3 has a plurality of suction holes to facilitate adsorbing the photosensitive material entered; at present, receiving a command by air cylinders 5 on two optical grating mound layer fixing plates 152, in such a manner that an optical grating clamping mechanism drives the optical grating to press downward to the photosensitive material, simultaneously, two motors 12 on two side faces of the base 1 start to operate, so as to drive two rollers 14 to rotate right, the rollers 14 rotated right drive two endless round belts 13 provided thereon to move right, and the two endless round belts 13 drive the optical grating pressing mechanism 31 provided thereon to move right; meanwhile, two shutter devices 6 start to operate as well, a right shutter device 6 recycles one of the two roller shutters 61 and a left shutter device 6 releases the other of the two roller shutters 61, in such a manner that the base 1 is covered all the time, so that the grating photographic material in the photosensitive platform 3 is not mapped by beams, meanwhile, an air cylinder 5 on the optical grating pressing mechanism 31 starts to operate, in such a manner that a slideway fixing plate 313 is pressed downward, two sliding blocks on the slideway fixing plate 313 are forced to move downward along two slideways of a pressure plate roller set fixing plate 315, respectively, so as to drive the pressure plate roller set fixing plate 315 to push downward, in such a manner that the light shielding pressure rollers 314 are capable of compressing the optical grating and the photosensitive material closely together; meanwhile, a motor 21 on a gantry 2 receives an instruction from the exposure system device 4 to drive a screw to rotate, the screw rotated drives two sliding blocks on the exposure system device 4 to move right, in such a manner that the exposure system device 4 starts to move right, wherein the exposure system device 4 and the optical grating pressing mechanism 31 move synchronously in a relatively static manner wherein the exposure system device 4 emits laser via a laser scan line opening provided on a bottom thereof, the laser emitted is applied on two light shielding pressure rollers 314 of the optical grating pressing mechanism 31, wherein since a laser scan line hole is provided between the two light shielding pressure rollers 314, the laser emitted by the exposure system device 4 passes through the laser scan line hole between the two light shielding pressure rollers 314 and performs a first scanning exposure on the photographic material; when the first scanning exposure is finished, the air cylinder 5 of the optical grating pressing mechanism 31 operates to lift up the light shielding pressure rollers 314 on the pressure plate roller set fixing plate 315, the air cylinders 5 on the optical grating mound layer fixing plates 152 operate to keep the optical grating mound layer fixing plates 152 pressing on the photosensitive platform 3; meanwhile the motors 12 on the base 1 start to rotate left and drive the two rollers 14 to rotate, then the two rollers 14 drive the optical grating pressing mechanism 31 to move left, then the two shutter devices 6 start to operate simultaneously, the left shutter device 6 collects one of the roller shutters 61 and the right shutter device 6 releases the other of the roller shutters 61, in such a manner that the base 1 is covered all the time, meanwhile the motor 21 on the gantry 2 receives an instruction from the exposure system device 4 to drive the screw to rotate, the screw rotated drives the exposure system device 4 to move left, the exposure system device 4 and the optical grating pressing mechanism 31 move left synchronously a relatively static manner, so as to return back to an original position;

step S2: sending information of a second image by the computer when the first scanning exposure is finished, wherein when the exposure system device 4 receives the information, the photosensitive platform 3 starts to deviate from a position thereof in the step S1, so as to have a different position with a scan line in the step S1, meanwhile the exposure system device 4, the optical grating pressing mechanism 31 and the shutter devices 6 start to synchronously move right to complete second scanning exposure, when the second scanning exposure is completed, the exposure system device 4, the optical grating pressing mechanism 31, the photosensitive platform 3 and the shutter devices 6 all return back to original positions;

step S3: sending information of a third image by the computer when the second scanning exposure is finished, wherein when the exposure system device 4 receives the information, the photosensitive platform 3 starts to deviate from a position thereof in the step S2, so as to have a different position with a scan line in the step S2, meanwhile the exposure system device 4, the optical grating pressing mechanism 31 and the shutter devices 6 start to synchronously move right to complete a third scanning exposure; and S4: repeating the step S2 and S3 until all scans are completed, wherein the air cylinders 5 of the optical grating mound layer fixing plates 152 on the photosensitive platform 3 receive an instruction from the exposure system device 4 to elevate the optical grating mound layer fixing plates 152 to an original position, then the optical grating is elevated and the photosensitive material below the optical grating enters a developing device for developing.

Preferably, the method further comprises a step of selecting a prototype grating before the step S1, which comprises steps of before printing a stereo image which has a far vision distance and a good stereoscopic effects, determining a number of lines of the optical grating, and selecting any sheet of optical grating from a batch of optical grating sheets which are punched with needle-shaped focus hole to be placed on the photosensitive platform for serving as the prototype grating and clamping the optical grating clamping mechanisms on two sides of the photosensitive platform.

Preferably, the method further comprises a step before the step S1 of: when thick optical gratings in a same batch is utilized in other dedicated device, punching a plurality of focus holes on two ends and two sides of the optical grating according to the line ways thereof.

The method further comprises a step after the step S4 of combining alignment of holes of a stereo image printed and dried by projection photoreception, photoreception focusing points and a batch of optical gratings having focus holes.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A movable pressing and light-shielding mechanism for digital stereo image printing comprising a base, multiple gantries, a photosensitive platform and an exposure system device;

wherein the base has a groove inside which the photosensitive platform is provided;

an amount of the gantries is two, the two gantries are provided in parallel and fixed on the base, a slideway is provided between the two gantries;

a screw is provided in the slideway, one end of the screw is connected with a second motor; and the second motor is connected with the exposure system device;

two sliding blocks are provided on an top end face of the exposure system device, and the exposure system device is connected with the screw via the two sliding blocks; and a laser scan line opening is provided on a bottom surface of the exposure system equipment.

2. The movable pressing and light-shielding mechanism for digital stereo image, as recited in claim 1, wherein a photographic paper conveyor is provided on the photosensitive platform 3, and the photographic paper conveyor has a plurality of suction holes and is sleeved on the photosensitive platform;

two first motors are respectively provided on two sides of the base, and are connected with the exposure system device;

two endless round belts are respectively provided in parallel on a front side and a back side of the base;

two rollers are respectively provided in parallel on a left side and a right side of the up surface of the base, and two shutter devices are respectively provided above the two rollers, the two rollers run through the base and the photosensitive platform;

the two endless round belts are respectively sleeved on the two rollers, and the two first motors provided at one side of the base are respectively connected with an ends of the two rollers via two tyres.

3. The movable pressing and light-shielding mechanism for digital stereo image, as recited in claim 1, wherein two optical grating clamping mechanisms are respectively and movably provided on two sides of the photosensitive platform, the two optical grating clamping mechanisms respectively comprise an optical grating mound layer fixing plate, a optical grating mound layer and a first air cylinder, the air cylinder is connected with the exposure system device, the optical grating mound layer fixing plate is movably provided on two sides above the photosensitive platform, and the optical grating mound layer is provided on the optical grating mound layer fixing plate.

4. The movable pressing and light-shielding mechanism for digital stereo image, as recited in claim 1, wherein an optical grating pressing mechanism is provided on the photosensitive platform, the optical grating pressing mechanism comprises a sliding block fixing plate, two sliding blocks, a slideway fixing plate, a light shielding pressure roller, a pressure plate roller set fixing plate, a pressure plate roller set side plate and a strengthening support rod;

an air cylinder is provided on the sliding block fixing plate and the two sliding block are fixed on two ends of the sliding block fixing plate, an air cylinder connecting unit is provided on the pressure plate roller set fixing plate and the two sliding blocks are fixed two ends of the sliding block fixing plate;

an laser scan line opening is provided between the light shielding pressure roller, two parallel slideways are provided on a rear surface of the pressure plate roller set fixing plate; and the slideway fixing plate has two sliding blocks provided thereon and is limited in the slideway of the pressure plate roller set fixing plate via the sliding blocks, so as to form a flexible connection;

the pressure plate roller set side plate is mounted on the pressure plate roller set fixing plate, two light shielding pressure rollers are provided on a bottom of the pressure plate roller set side plate.

5. The movable pressing and light-shielding mechanism for digital stereo image, as recited in claim 2, wherein the two sliding blocks of the sliding block fixing plate of the optical grating pressing mechanism are respectively provided on the two endless round belts.

6. The movable pressing and light-shielding mechanism for digital stereo image, as recited in claim 2, wherein a roll of roller shutter having a same size with an upper surface of the base is respectively provided in the two shutter devices, wherein a first end of each of the roller shutters is mounted inside each of the shutter device and a second end thereof is mounted on the sliding block fixing plate of the optical grating pressing mechanism.

7. A method for the movable pressing and light-shielding mechanism for digital stereo image, comprising following steps of:

step S1: before running the movable pressing and light-shielding mechanism, putting an optical grating in a photosensitive platform, so as to clamp the optical grating by an optical grating mound layer and an optical grating mound layer fixing plate, obtaining information of an image from a computer by an exposure system device, wherein a sheet of photographic material automatically enters between the photographic paper conveyor and the optical grating on the photosensitive platform, and a photographic paper conveyor sleeved on the photosensitive platform has a plurality of suction holes to facilitate adsorbing the photosensitive material entered;

at present, receiving a command by air cylinders on two optical grating mound layer fixing plate which clamps the optical grating, in such a manner that an optical grating clamping mechanism drives the optical grating to press downward to the photosensitive material, simultaneously, two motors on two side faces of the base start to operate, so as to drive two rollers to rotate right, the two rollers rotated right drives two endless round belts provided thereon to move right, and the two endless round belts drive the optical grating pressing mechanism provided thereon to move right; meanwhile, two shutter device start to operate as well, a right shutter device recycles one of the two rollers shutters and a left shutter device releases the other of the roller shutters, in such a manner that the base is covered all the time, in such a manner that the grating photographic material in the photosensitive platform is not mapped by beams, meanwhile, an air cylinder on the optical grating pressing mechanism starts to operate, in such a manner that a slideway fixing plate is pressed downward, two sliding blocks on the slideway fixing plate are forced to move downward along two slideways of a pressure plate roller set fixing plate, respectively, so as to drive the pressure plate roller set fixing plate to push downward, in such a manner that the light shielding pressure rollers are capable of compressing the optical grating and a part of the photosensitive material closely together; meanwhile, a motor on a gantry receives an instruction from the exposure system device to drive a screw to rotate, the screw rotated drives two sliding blocks on the exposure system device to move right, in such a manner that the exposure system device starts to move right, wherein the exposure system device and the optical grating pressing mechanism move synchronously in a relatively static manner, wherein the exposure system device emits laser via a laser scan line opening provided on a bottom thereof, the laser emitted is applied on two light shielding pressure rollers of the optical grating pressing mechanism, wherein since a laser scan line hole is provided between the two light shielding pressure rollers, the laser emitted by the exposure system device passes through the laser scan line hole between the two light shielding pressure rollers and performs a first scanning exposure on the photographic material;

when the first scanning exposure is finished, the air cylinder of the optical grating pressing mechanism operates to lift up the light shielding pressure rollers on the pressure plate roller set fixing plate, the air cylinders on the optical grating mound layer fixing plates operates to keep the optical grating mound layer fixing plate pressing on the photosensitive platform;

meanwhile the motors on the base starts to rotate left and drive the two rollers to rotate, then the two rollers drives the optical grating pressing mechanism to move left, then the two shutter devices start to operate simultaneously, the left shutter device collects one of the roller shutters and the right shutter device releases the other of the roller shutters, in such a manner that the base is covered all the time, meanwhile the motor on the gantry receives an instruction from the exposure system device to drive the screw to rotate, the screw rotated drives the exposure system device to move left, the exposure system device and the optical grating pressing mechanism move left synchronously in opposite position, so as to return back to an original position;

step S2: sending information of a second image by the computer when the first scanning exposure is finished, wherein when the exposure system device receives the information, the photosensitive platform starts to deviate from a position thereof in the step S1, so as to have a different position with a scan line in the step S1, meanwhile the exposure system device, the optical grating pressing mechanism and the shutter devices start to synchronously move right to complete second scanning exposure, when the second scanning exposure is completed, the exposure system device, the optical grating pressing mechanism, the photosensitive platform and the shutter device all return back to original positions;

step S3: sending information of a third image by the computer when the second scanning exposure is finished, wherein when the exposure system device receives the information, the photosensitive platform starts to deviate from a position in the step S2, so as to have a different position with a scan line in the step S2, meanwhile the exposure system device, the optical grating pressing mechanism and the shutter device start to synchronously move right to complete a third scanning exposure;

S4: repeating the step S2 and S3 until all scans are completed, wherein the air cylinder of the optical grating mound layer fixing plate on the photosensitive platform receives an instruction from the exposure system device to elevate the optical grating mound layer fixing plates to an original position, then the optical grating is elevated and the photosensitive material below the optical grating enters a developing device for developing.

* * * * *